(12) United States Patent
Liu et al.

(10) Patent No.: US 12,356,756 B2
(45) Date of Patent: Jul. 8, 2025

(54) PASSIVATING CONTACT STRUCTURE AND PREPARATION METHOD THEREOF, SOLAR CELL AND PREPARATION METHOD THEREOF

(71) Applicant: TRINA SOLAR CO., LTD, Changzhou (CN)

(72) Inventors: Chengfa Liu, Changzhou (CN); Hong Chen, Changzhou (CN); Yaqian Zhang, Changzhou (CN); Xiaopeng Wu, Changzhou (CN); Yugang Lu, Changzhou (CN); Shuai Zhang, Changzhou (CN)

(73) Assignee: TRINA SOLAR CO., LTD, Changzhou (CN)

( * ) Notice: Subject to any disclaimer, the term of this patent is extended or adjusted under 35 U.S.C. 154(b) by 0 days.

(21) Appl. No.: 18/383,097

(22) Filed: Oct. 24, 2023

(65) Prior Publication Data
US 2024/0055539 A1    Feb. 15, 2024

(30) Foreign Application Priority Data

Jun. 7, 2023 (CN) .......................... 202310665796.1

(51) Int. Cl.
*H10F 77/20* (2025.01)
*H10F 10/166* (2025.01)
*H10F 71/00* (2025.01)

(52) U.S. Cl.
CPC ......... *H10F 77/211* (2025.01); *H10F 10/166* (2025.01); *H10F 71/121* (2025.01); *H10F 71/129* (2025.01)

(58) Field of Classification Search
None
See application file for complete search history.

(56) References Cited

U.S. PATENT DOCUMENTS

2004/0102026 A1    5/2004  Wong et al.
2018/0277701 A1*   9/2018  Lenes ..................... C23C 16/28

FOREIGN PATENT DOCUMENTS

CN    110473926 A    11/2019
CN    110690324 A    1/2020
(Continued)

OTHER PUBLICATIONS

Machine translation of WO2021/068586A1 (Year: 2021).*
(Continued)

*Primary Examiner* — Ryan S Cannon
(74) *Attorney, Agent, or Firm* — Taft Stettinius & Hollister LLP

(57) ABSTRACT

The present application relates to a passivating contact structure and a preparation method thereof, and a solar cell and a preparation method thereof. In the method for preparing the passivating contact structure, a tunnel layer is formed on a side of a substrate; an initial stack structure is formed on a side of the tunnel layer away from the substrate. The initial stack structure includes polysilicon layers and a doped layer alternately stacked. In the initial stack structure, an innermost layer is most adjacent to the tunnel layer, an outermost layer is most away from the tunnel layer, the innermost layer and the outermost layer are both polysilicon layers. The doped layer is a polysilicon material layer doped with a dopant. The dopant is activated, such that the dopant diffuses into the polysilicon layers, thereby transforming the initial stack structure into a doped stack structure with uniform distribution of dopant.

13 Claims, 5 Drawing Sheets

(56) References Cited

FOREIGN PATENT DOCUMENTS

| | | | |
|---|---|---|---|
| CN | 112951927 | A | 6/2021 |
| CN | 113555469 | A | 10/2021 |
| CN | 114038928 | A | 2/2022 |
| CN | 114188429 | A | 3/2022 |
| CN | 114709277 | A | 7/2022 |
| CN | 115425115 | A | 12/2022 |
| CN | 116130530 | A | 5/2023 |
| WO | 2021068586 | A1 | 4/2021 |
| WO | 2023071329 | A1 | 5/2023 |

OTHER PUBLICATIONS

European Patent Office, Extended European Search Report issued in corresponding Application No. 23204918.9, dated Mar. 19, 2024, 8 pp.

Chinese Patent Office, Supplemental Search Report issued in corresponding Application No. 2023106657961, dated Jan. 4, 2024, 2 pp.

Guo et al., "Effect of Interlayer Doping on a-Si : H/μc-Si : H tandem Cells with Tunneling Structure," Research & Progress of SSE, vol. 40, No. 1, Feb. 2020, 8 pp., English Abstract Included.

Chinese Office Action for corresponding Application No. 202310665796.1 dated Jul. 12, 2023, 8 pages.

\* cited by examiner

PASSIVATING CONTACT STRUCTURE AND PREPARATION METHOD THEREOF, SOLAR CELL AND PREPARATION METHOD THEREOF

CROSS-REFERENCE TO RELATED APPLICATION

This application claims priority to Chinese patent application No. 202310665796.1, filed on Jun. 7, 2023, and titled "PASSIVATING CONTACT STRUCTURE AND PREPARATION METHOD THEREOF, SOLAR CELL AND PREPARATION METHOD THEREOF", the content of which is hereby incorporated herein in its entirety by reference.

TECHNICAL FIELD

The present application relates to the field of photovoltaic technology, in particular to a passivating contact structure and a preparation method thereof, and a solar cell and a preparation method thereof.

BACKGROUND

In a tunnel oxide passivated contact (TOPCon) solar cell, a tunnel oxide layer and a heavily doped polysilicon layer are formed on the back of the cell, together forming a passivating contact structure, which provides a good surface passivation for the back of the silicon wafer.

However, in mass production, the growth uniformity of the tunnel oxide layer and the heavily doped polysilicon layer is difficult to control, making it difficult to balance the process effects on the tunnel oxide layer and the heavily doped polysilicon layer, which reduces the conversion efficiency of TOPCon cells.

SUMMARY

The present application provides a passivating contact structure and a preparation method thereof, and a solar cell and a preparation method thereof.

According to a first aspect of the present application, a method for preparing a passivating contact structure is provided. The method includes:
  forming a tunnel layer on a side of a substrate;
  forming an initial stack structure on a side of the tunnel layer away from the substrate, wherein the initial stack structure includes polysilicon layers and a doped layer alternately stacked with each other, in the initial stack structure, an innermost layer is a layer most adjacent to the tunnel layer, an outermost layer is a layer most away from the tunnel layer, the innermost layer and the outermost layer are two of the polysilicon layers, and the doped layer is a polysilicon material layer doped with a dopant; and
  activating the dopant in the doped layer, such that the dopant diffuses into the polysilicon layers, thereby transforming the initial stack structure into a doped stack structure with uniform distribution of dopant.

In some embodiments, before activating the dopant in the doped layer, the dopant concentration of regions of the doped layer adjacent to the polysilicon layers is smaller than the dopant concentration of a region of the doped layer away from the polysilicon layers, and the dopant concentration of the regions of the doped layer adjacent to the polysilicon layers is greater than the dopant concentration of the polysilicon layers.

In some embodiments, before activating the dopant in the doped layer, the dopant concentration of the doped layer is symmetrically distributed from a central plane of the doped layer to two sides of the doped layer away from the central plane, the distance between the central plane and one of the two sides of the doped layer away from the substrate is equal to the distance between the central plane and the other one of the two sides of the doped layer adjacent to the substrate.

In some embodiments, the doped layer includes a plurality of first doped polysilicon layers, and the plurality of first doped polysilicon layers are stacked in the direction away from the tunnel layer.

In some embodiments, the plurality of first doped polysilicon layers are arranged symmetrically about a central plane of the doped layer, and the dopant in every two of the plurality of first doped polysilicon layers that are symmetrically arranged is distributed symmetrically about the central plane, the distance between the central plane and one side of the doped layer away from the substrate is equal to the distance between the central plane and another side of the doped layer adjacent to the substrate.

In some embodiments, the doped layer is a plurality of doped layers, on a condition that the plurality of doped layers have the same dopant concentration, the thickness of the polysilicon layer between two adjacent doped layers is greater than each of the thickness of the polysilicon layer which is also the innermost layer and the thickness of the polysilicon layer which is also the outermost layer.

In some embodiments, each of the polysilicon layers includes an intrinsic polysilicon layer or a second doped polysilicon layer, and the dopant concentration of the second doped polysilicon layer is smaller than the dopant concentration of the doped layer.

In some embodiments, the innermost layer in the initial stack structure is the second doped polysilicon layer, and the dopant concentration of a region of the innermost layer adjacent to the tunnel layer is smaller than the dopant concentration of a region of the innermost layer away from the tunnel layer.

In some embodiments, the innermost layer in the initial stack structure is the second doped polysilicon layer, and a dopant position in the innermost layer is spaced from a surface of the innermost layer adjacent to the tunnel layer.

In some embodiments, the outermost layer in the initial stack structure is the second doped polysilicon layer, and a dopant position in the outermost layer is spaced from a surface of the outermost layer away from the tunnel layer.

In some embodiments, a refractive index of the doped layer is greater than a refractive index of the polysilicon layers.

In some embodiments, the refractive index of the doped layer is in a range from 4.1 to 4.5, and the refractive index of the polysilicon layers is in a range from 3.88 to 4.10.

In some embodiments, the dopant concentration of the doped stack structure is in a range from $1E20$ atoms/cm$^3$ to $8E20$ atoms/cm$^3$, and a dopant concentration difference between any two regions in the doped stack structure is less than or equal to $2E20$ atoms/cm$^3$.

According to a second aspect of the present application, a passivating contact structure is provided. The passivating contact structure is prepared by the above method for preparing the passivating contact structure.

According to a third aspect of the present application, a solar cell is provided. The solar cell includes a substrate and the above-described passivating contact structure disposed on one side of the substrate.

In some embodiments, the solar cell further includes a first passivation layer disposed on a side of the passivating contact structure away from the tunnel layer.

In some embodiments, the substrate includes a first surface and a second surface opposite to each other, and the passivating contact structure is disposed on the second surface. The solar cell further includes a second passivation layer disposed on the first surface of the substrate.

According to a fourth aspect of the present application, a method for preparing a solar cell is provided. The method includes following steps of:

provide a substrate;

forming a passivating contact structure on one side of the substrate by the method for preparing the passivating contact structure.

In some embodiments, the method further includes a step of forming a first passivation layer on a side of the passivating contact structure away from the tunnel layer.

In some embodiments, the substrate includes a first surface and a second surface opposite to each other, and the passivating contact structure is disposed on the second surface. The method further includes a step of forming a second passivation layer on the first surface of the substrate.

According to a fifth aspect of the present application, a photovoltaic device is provided. The photovoltaic device includes a cell group, wherein the cell group includes one or more connected above-described solar cells; or the cell group includes one or more connected solar cells prepared by the above-described method for preparing the solar cell.

According to a sixth aspect of the present application, a photovoltaic system is provided. The photovoltaic system includes the above-described photovoltaic device.

In the methods for preparing the passivating contact structure and the solar cell, on the one hand, due to the dopant concentration difference between the polysilicon layer which is also the innermost layer and the doped layer adjacent to the innermost layer, the polysilicon layer which is also the innermost layer can isolate the doped layer from the tunnel layer, so as to prevent the tunnel layer from being penetrated by diffusion, thereby improving the passivation effect of the tunnel layer. On the other hand, the initial stack structure includes the alternately stacked polysilicon layers and doped layer(s), and the innermost layer and the outermost layer in the initial stack structure are both polysilicon layers. Based on the dopant concentration difference between the polysilicon layers and the doped layer adjacent to the polysilicon layers, the dopant in the doped layer can be diffused to the polysilicon layers on the two sides, which can reduce the amount of dopant diffused toward the substrate during the activation process, and can make the distribution of the dopant more uniform after the activation process so as to reduce the contact resistivity. Thus, the above described methods and the passivating contact structure, the solar cell, the photovoltaic device and the photovoltaic system can balance the process effects on the tunnel layer and the doped stack structure, and improve the conversion efficiency of the solar cell.

BRIEF DESCRIPTION OF THE DRAWINGS

In order to more clearly describe the embodiments of the present application, the accompanying drawings to be used in the description of the embodiments will be described briefly. Obviously, the drawings described below are only for some embodiments of the present application. For ordinary skilled persons in the art, other drawings can also be obtained based on the following drawings without creative work.

DETAILED DESCRIPTION

The present application will now be described in detail with reference to the accompanying drawings and embodiments in order to make the objects, technical solutions, and advantages of the present application more clear. The embodiments described herein are for the purpose of explaining the present application and are not intended to limit the present application.

The terms "first" and "second" are used merely as labels to distinguish one element having a certain name from another element having the same name, and cannot be understood as indicating or implying any priority, precedence, or order of one element over another, or indicating the quantity of the element. Therefore, the element modified by "first" or "second" may explicitly or implicitly includes at least one of the elements. In the description of the present application, "a plurality of" means at least two, such as two, three, etc., unless otherwise specifically defined.

An element, when being referred to as being "disposed" on another element, may be disposed on the other element directly or via an intermediate element. An element, when being referred to as being "connected" to another element, may be connected to the other element directly or via an intermediate element.

Figure 1:
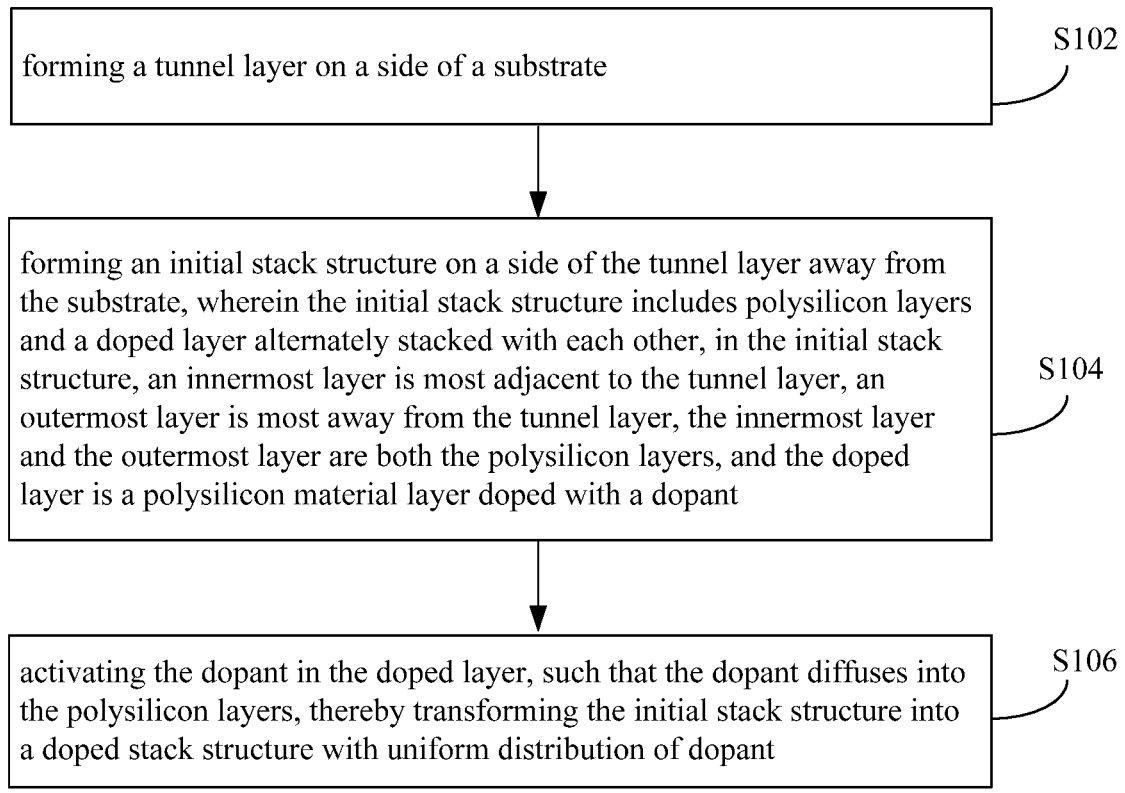
FIG. 1 is a flow chart of a preparation method of a passivating contact structure according to an embodiment.

Referring to FIG. 1, in an embodiment, a method for preparing a passivating contact structure includes steps S102 to S106.

Step 102, a tunnel layer is formed on a side of a substrate.

The substrate includes a first surface and a second surface opposite to each other. Taking the TOPCon cell as an example, both the first and second surfaces of the substrate can be used to receive incident light and generate photogenerated carriers. One of the first surface and the second surface can be the surface facing the sun (also known as the front surface), and the other one can be the surface facing away from the sun (also known as the back surface). Optionally, the substrate can be a silicon wafer doped with an N-type element or a P-type element. The N-type element can be any one of phosphorus, arsenic, or antimony. The P-type element can be boron, as an example.

The tunnel layer is formed on the first surface or the second surface of the substrate to combine with the dangling bonds on that surface to suppress the carrier recombination on that surface of the solar cell, thereby realizing the interface passivation effect on that surface and improving photoelectric conversion efficiency of the solar cell. It can be understood that the tunnel layer can be formed on the surface of the substrate facing away from the sun, so that the passivating contact structure is a back passivating contact structure. Optionally, the material of the tunnel layer can be a dielectric material, such as at least one of silicon oxide, magnesium fluoride, amorphous silicon, polycrystalline silicon (polysilicon), silicon carbide, silicon nitride, silicon oxynitride, aluminum oxide, or titanium oxide.

Step 104, an initial stack structure is formed on a side of the tunnel layer away from the substrate. The initial stack structure includes polysilicon layers and a doped layer(s) alternately stacked with each other. In the initial stack structure, the layer most adjacent to the tunnel layer (i.e., the innermost layer) and the layer most away from the tunnel layer (i.e., the outermost layer) are both polysilicon layers. The doped layer(s) is a polysilicon material layer doped with a dopant.

Figure 2:
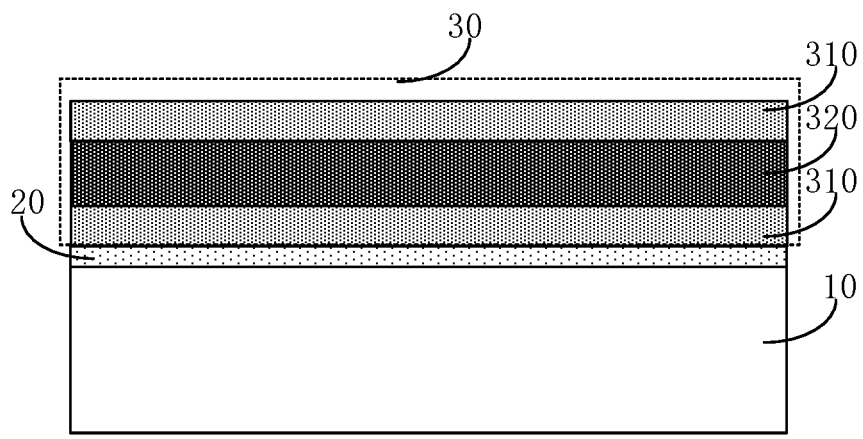
FIG. 2 is a schematic structural view of a passivating contact structure according to an embodiment.

Referring to FIG. 2, the initial stack structure includes the alternately stacked polysilicon layers and doped layer(s). In FIG. 2, 10 is the reference sign for a substrate, 20 is the reference sign for a tunnel layer, 30 is the reference sign for an initial stack structure, 310 is the reference sign for a polysilicon layer, and 320 is the reference sign for a doped layer. The doped layer is a heavily doped polysilicon material (poly-Si) layer implanted with a dopant. The concentration of the dopant in the doped layer is greater than or much greater than the concentration of the dopant in the polysilicon layer, so that the doped layer can form a high-low junction structure with the polysilicon layers and can provide the dopant to the polysilicon layers.

The innermost layer which is most adjacent to the tunnel layer in the initial stack structure is one polysilicon layer formed on the side of the tunnel layer away from the substrate. Based on the dopant concentration difference between the polysilicon layer which is also the innermost layer and the doped layer adjacent to the innermost layer, the polysilicon layer which is also the innermost layer can isolate the doped layer from the tunnel layer, and has a good blocking effect on the diffusion of the dopant toward the substrate during the subsequent activation process, so as to prevent the tunnel layer from being penetrated by diffusion, thereby improving the passivation effect of the tunnel layer and significantly increasing the open circuit voltage of the cell product.

The outermost layer which is most away from the tunnel layer in the initial stack structure is another polysilicon layer. Based on the dopant concentration difference between the polysilicon layer which is also the outermost layer and the doped layer adjacent to the outermost layer, the dopant in the doped layer can be diffused toward the polysilicon layer which is also the outermost layer, which on the one hand can reduce the amount of dopant diffused toward the substrate during the activation process, preventing excessive dopant from entering into the substrate. On the other hand, the distribution of the dopant is more uniform after the activation process.

Step 106, the dopant in the doped layer(s) is activated, such that the dopant diffuses into the polysilicon layers, thereby transforming the initial stack structure into a doped stack structure in which the dopant is more evenly distributed.

To active the dopant, the doped layer(s) can be annealed, for example, in a nitrogen atmosphere, to activate the dopant in the doped layer(s). It can be understood that the various parameters of the annealing step can be adjusted and set according to the thicknesses of the doped layer(s) and the polysilicon layers, the total amount of dopant, the concentration of dopant, etc., which are not further limited in the present embodiment.

Figure 3:
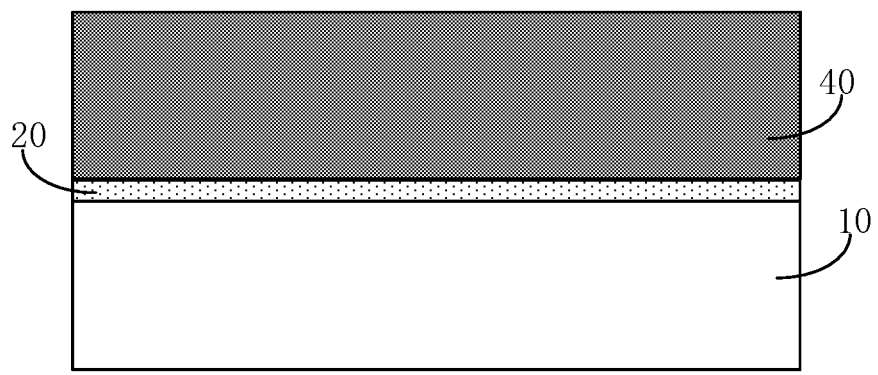
FIG. 3 is a schematic structural view of a passivating contact structure according to another embodiment.

After the dopant is activated, the dopant in each doped layer will diffuse to the polysilicon layers on two sides of the doped layer, so that the concentration of dopant in the polysilicon layers on the two sides of the doped layer is gradually equal to the concentration of dopant in the doped layer. As such, the initial stack structure with uneven dopant distribution is gradually transformed into a doped stack structure with uniform dopant distribution (as shown in FIG. 3). In FIG. 3, 10 is the reference sign for a substrate, 20 is the reference sign for a tunnel layer, and 40 is the reference sign for a doped stack structure. Compared with diffusion towards a single side, the distribution of the dopant in the present embodiment is more uniform after the activation step, the passivating contact structure is more resistant to slurry corrosion, the contact resistivity thereof is significantly reduced, and the open circuit thereof is significantly improved.

In the related art, in order to reduce the risk of the tunnel layer being fired-through, the growth uniformity of the tunnel layer has to be improved in order to prevent that a local area in the tunnel layer is thinner and more likely to be fired-through. However, as the thickness of the overall tunnel layer is already small, the uniformity thereof is difficult to control. Moreover, in order to reduce the contact resistivity of the passivating contact structure, the dopant concentration of the doped layer has to be increased. However, the increase in dopant concentration makes it easier for the dopant to damage the tunnel layer during the annealing, and the heavier doping will cause serious parasitic absorption. Therefore, it is difficult to balance the process effects on the tunnel oxide layer and the heavily doped polysilicon layer in the methods in the related art, which reduces the conversion efficiency of the solar cell and results defective cells.

In the method for preparing the passivating contact structure provided in the present embodiment, on the one hand, due to the dopant concentration difference between the polysilicon layer which is also the innermost layer and the doped layer adjacent to the innermost layer, the polysilicon layer which is also the innermost layer can isolate the doped layer from the tunnel layer, preventing the tunnel layer from being penetrated by the activated dopant, thereby improving the passivation effect of the tunnel layer. On the other hand, the initial stack structure includes the alternately stacked polysilicon layers and doped layer(s), and the innermost layer and the outermost layer in the initial stack structure are both polysilicon layers. Based on the dopant concentration difference between the polysilicon layers and the doped layer adjacent to the polysilicon layers, the dopant in the doped layer can be diffused to the polysilicon layers on the two sides, which can reduce the amount of dopant diffused toward the substrate during the activation process, and can make the distribution of the dopant more uniform after the activation process as well and reduce the contact resistivity. Therefore, the preparation method of the present embodiment can balance the process effects on the tunnel layer and the doped stack structure, and improve the conversion efficiency of the solar cell.

Figure 4:
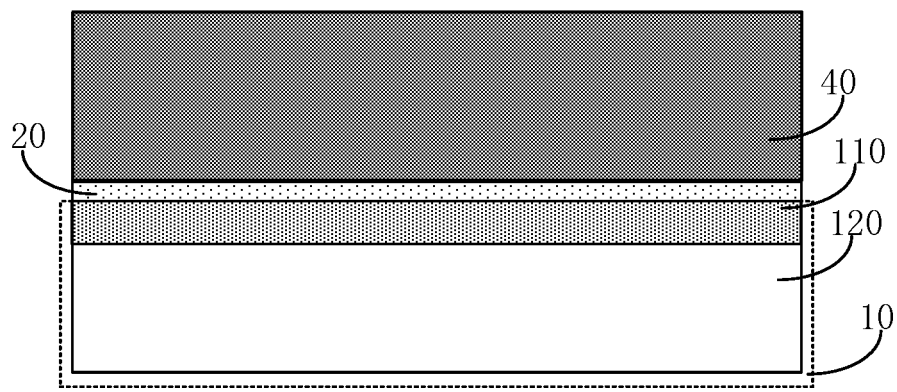
FIG. 4 is a schematic structural view of a passivating contact structure according to yet another embodiment.

Referring to FIG. 4, it is to be noted that after the activation, a doped crystalline silicon layer may be formed in the surface of the substrate that is in contact with the tunnel layer. In FIG. 4, 10 is the reference sign for a substrate, 110 is the reference sign for a doped crystalline silicon layer, 20 is the reference sign for a tunnel layer, 40 is the reference sign for a doped stack structure. The doped crystalline silicon layer is formed due to diffusion of a small amount of dopant from the initial stack structure into the surface layer of the silicon wafer through the tunnel layer during the activation. In view of the blocking effect of the polysilicon layer in the present embodiment, the dopant concentration in the doped crystalline silicon layer is much smaller than that in the doped stack structure formed by the activation. Optionally, the concentration of dopant atoms is distributed in a gradient pattern in the doped crystalline silicon layer, which can improve the surface passivation effect on the one hand and reduce the carrier transfer resistance on the other hand.

In an embodiment, before the dopant in the doped layer is activated, in the doped layer, the dopant concentration in the regions adjacent to the polysilicon layers is smaller than that in the region away from the polysilicon layers, and the dopant concentration in the regions adjacent to the polysilicon layers is greater than that in the polysilicon layers.

On the one hand, since the dopant concentration in the regions adjacent to the polysilicon layers is smaller than the dopant concentration in the region away from the polysilicon layers, during the activation process, the dopant in the region away from the polysilicon layer will respectively diffuse toward the regions on the two sides adjacent to the polysilicon layers. On the other hand, since the dopant concentration in the regions adjacent to the polysilicon layers is greater than the dopant concentration in the polysilicon layers, during the activation process, the dopant in the regions on the two sides of the doped layer adjacent to the polysilicon layers will respectively diffuse toward the polysilicon layers. Therefore, the overall diffusion direction of the dopant of the doped layer is always from the central region of the doped layer to the regions on the two sides of the central region and to the polysilicon layers on the two sides of the doped layer, which further improves the uniformity of dopant distribution and reduces the contact resistivity.

It can be understood that in order to make the dopant concentration in the regions adjacent to the polysilicon layers in the doped layer smaller than that in the region away from the polysilicon layers, the implantation amount and implantation time of the dopant can be adjusted during the formation of the doped layer, which are not further limited in the present embodiment.

In an embodiment, on the basis of the dopant concentration in the regions adjacent to the polysilicon layers being smaller than that in the region away from the polysilicon layers in the doped layer, before the dopant in the doped layer is activated, the concentration of dopant in the doped layer is symmetrically distributed from a central plane of the doped layer to the two sides away from the central plane. The distance between the central plane and the surface of the doped layer away from the substrate is equal to the distance between the central plane and the surface of the doped layer adjacent to the substrate.

As the distance between the central plane and the surface of the doped layer away from the substrate is equal to the distance between the central plane and the surface of the doped layer adjacent to the substrate, the central plane is the center of the doped layer.

Before the dopant in the doped layer is activated, the closer to the central plane, the greater the dopant concentration, and the concentration of the dopant in the doped layer is symmetrically distributed from the central plane of the doped layer to the two sides away from the central plane. Therefore, the dopant concentration of the doped layer as a whole decreases symmetrically from the center plane to the two sides. Furthermore, the dopant concentration of the doped layer as a whole gradually decreases symmetrically from the center plane to the two sides.

It can be understood that the distribution of the dopant in the doped stack structure is affected by the dopant concentration of the doped layer in the initial stack structure. In the present embodiment, since the dopant concentration of the doped layer as a whole decreases symmetrically from the center plane to the two sides, the distribution of the dopant in the doped stack structure is more uniform after activation, due to the overall symmetric uniform diffusion of the dopant of the doped layer from the center plane to the two sides.

In an embodiment, on the basis of the dopant concentration in the regions adjacent to the polysilicon layers being smaller than that in the region away from the polysilicon layers in the doped layer, the doped layer can include multiple first doped polysilicon layers, which are stacked in the direction away from the tunnel layer.

The multiple first doped polysilicon layers can be, for example, two layers, three layers, four layers, etc., and the number of layers and the thickness of layers are not further limited in the present embodiment, as long as the overall thickness of the whole doped stack structure is satisfied. It can be understood that on the basis of the dopant concentration in the regions adjacent to the polysilicon layers being smaller than that in the region away from the polysilicon layers in the doped layer, the dopant concentration of the first doped polysilicon layer located at the center of the doped layer is greater than the dopant concentration of the first doped polysilicon layers located on the two sides of the doped layer. The multiple first doped polysilicon layers are different in dopant concentration, or at least one first doped polysilicon layer has different dopant concentrations in different regions thereof.

Figure 5:
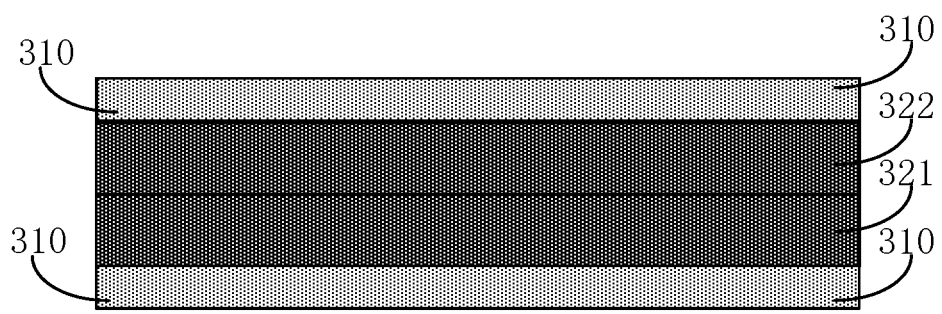
FIG. 5 is a schematic structural view of an initial stack structure according to an embodiment.

In an embodiment, the number of the first doped polysilicon layers in the doped layer is an even number, for example, as shown in FIG. 5, the doped layer includes two first doped polysilicon layers. In FIG. 5, 30 is the reference sign for an initial stack structure, 310 is the reference sign for a polysilicon layer, 321 is the reference sign for one first doped polysilicon layer, 322 is the reference sign for another first doped polysilicon layer. The dopant concentrations of the two first doped polysilicon layers can be the same or different, but each first doped polysilicon layer has different dopant concentrations in different regions thereof, so that the dopant in each first doped polysilicon layer diffuses toward the regions on the two sides during the activation process.

Figure 6:
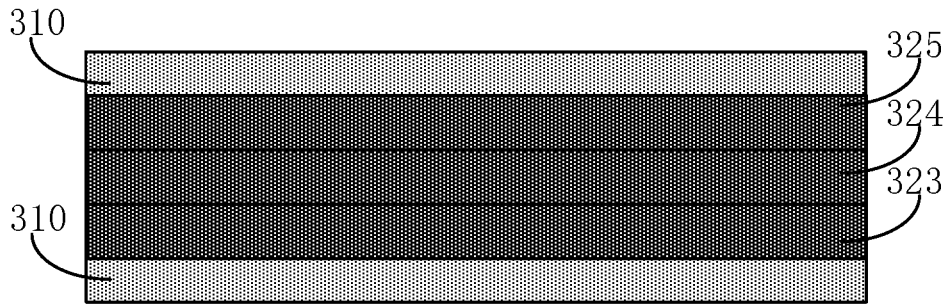
FIG. 6 is a schematic structural view of an initial stack structure according to another embodiment.

In an embodiment, the number of the first doped polysilicon layers in the doped layer is an odd number, for example, as shown in FIG. 6, the doped layer includes three first doped polysilicon layers, and the dopant concentration of the first doped polysilicon layer at the central region of the doped layer is greater than that the first doped polysilicon layers on the two sides. In FIG. 6, 30 is the reference sign for an initial stack structure, 310 is the reference sign for a polysilicon layer, 324 is the reference sign for the first doped polysilicon layer at the central region, 323 and 325 are the reference signs for the first doped polysilicon layers on the two sides. The two first doped polysilicon layers on the two sides can have the same or different dopant concentrations. As such, the dopants in the three first doped polysilicon layers diffuse toward the regions on the two sides during the activation process. It can be understood that each of the two first doped polysilicon layer on the two sides can have different dopant concentrations in different regions thereof or can have a uniform dopant concentration.

The multiple first doped polysilicon layers in the present embodiment is convenient for flexible adjustment of the dopant position and dopant concentration of the first doped polysilicon layers, improving the flexibility of dopant distribution in the doped layer.

Further optionally, on the basis of the previous embodiment, the multiple first doped polysilicon layers are arranged symmetrically about the central plane of the doped layer, and the dopant in every two first doped polysilicon layers that are symmetrically arranged is distributed symmetrically about the central plane. The distance between the central plane and the surface of the doped layer away from the substrate is equal to the distance between the central plane and the surface of the doped layer adjacent to the substrate.

In the multiple first doped polysilicon layers arranged symmetrically about the central plane of the doped layer, the positions or thicknesses of the multiple first doped polysilicon layers are symmetrical about the center plane. The dopant in every two first doped polysilicon layers that are symmetrically arranged is distributed symmetrically about the central plane, which means that in the two first doped polysilicon layers, the dopant has the same concentration and the position of the dopant is symmetrical with respect to the central plane.

Before the dopant in the doped layer is activated, the closer the first doped polysilicon layer to the center plane, the greater the dopant concentration of the first doped polysilicon layer, and dopant in every two first doped polysilicon layers that are symmetrically arranged is distributed symmetrically about the central plane. Therefore, the dopant concentration in the multiple first doped polysilicon layers decreases symmetrically from the first doped polysilicon layer in the central plane to the first doped polysilicon layers on the two sides of the central plane, e.g., in a gradient manner.

It can be understood that the distribution of the dopant in the doped stack structure is affected by the dopant concentration of the doped layer in the initial stack structure. In the present embodiment, since the dopant concentration in the multiple first doped polysilicon layers decreases symmetrically from the first doped polysilicon layer in the central plane to the first doped polysilicon layers on the two sides of the central plane, the distribution of the dopant in the doped stack structure is more uniform after activation, due to the overall symmetric uniform diffusion of the dopant of the doped layer from the center plane to the two sides.

It can be understood that in other embodiments the doped layer can include only one first doped polysilicon layer, and the dopant concentration of the first doped polysilicon layer can symmetrically decrease from the central plane of the first doped polysilicon layer to the two sides away from the center plane. The distance between the central plane and the side of the first doped polysilicon layer away from the substrate is equal to the distance between the central plane and the side of the first doped polysilicon layer adjacent to the substrate. For relevant descriptions, reference can be made to the descriptions of the symmetrical distribution in the above embodiments, and details are not repeated herein.

In some embodiments, the number of the doped layers in any of the above embodiments can be plural.

When multiple doped layers are included, the growth of the multiple doped layers and the multiple polysilicon layers is as follows: one polysilicon layer is formed on the surface of the tunnel layer away from the substrate, one doped layer is formed on the surface of the polysilicon layer away from the tunnel layer, and one polysilicon layer is formed on the doped layer, which is a growth cycle. The growth cycle is repeated for multiple times, and the innermost layer of the initial stack structure adjacent to the tunnel layer and the outermost layer of the initial stack structure away from the tunnel layer are both polysilicon layers.

It can be understood that, in the present embodiment, the repetition times of growth cycle forming the polysilicon layer, the doped layer, and the polysilicon layer are not specifically limited, and can be adjusted and set according to actual requirements. The thicknesses of the doped layers can be the same or different.

Optionally, when the dopant concentrations of the multiple doped layers are the same, the thickness of the polysilicon layer between two adjacent doped layers is respectively greater than the thickness of the polysilicon layer which is also the innermost layer and the thickness of the polysilicon layer which is also the outermost layer.

Due to the dopant concentration difference between a polysilicon layer and two doped layers adjacent to the polysilicon layer, the dopant in the two adjacent doped layers diffuse toward the polysilicon layer between the two adjacent doped layers. Therefore, when the dopant concentrations of multiple doped layers are the same, the thickness of the polysilicon layer between two adjacent doped layers being respectively greater than the thickness of the polysilicon layer which is also the innermost layer and the thickness of the polysilicon layer which is also the outermost layer is conducive to further improving the uniformity of the dopant distribution in the polysilicon layers.

In an embodiment, the polysilicon layer includes an intrinsic polysilicon layer or a second doped polysilicon layer, and the concentration of dopant in the second doped polysilicon layer is smaller than that of the dopant in the doped layer. In the present embodiment, since the dopant concentration in the polysilicon layer is always smaller than the dopant concentration in the doped layer, whether the polysilicon layer is the intrinsic polysilicon layer or is the second doped polysilicon layer, the initial stack structure can isolate the doped layer from the tunnel layer and can reduce the amount of the dopant diffused to the substrate during the activation process. In addition, the dopant can be evenly distributed in the doped stack structure to improve the conversion efficiency of the solar cell.

When the polysilicon layer includes the intrinsic polysilicon layer, the concentration of the dopant in the intrinsic polysilicon layer can be substantially equal to zero, and thus the concentration of the dopant in the intrinsic polysilicon layer is much smaller than that of the dopant in the doped layer. In this case, the intrinsic polysilicon layer which is also the innermost layer provides a relatively strong isolation and barrier effect between the doped layer and the tunnel layer, which can further reduce the amount of dopant diffused to the substrate during the activation process. The intrinsic polysilicon layer which is also the outermost layer can make more dopant in the doped layer diffuse to the outermost layer. In addition, when the number of doped layers is plural, the intrinsic polysilicon layer between adjacent doped layers makes the dopant from the doped layer more uniformly distributed in the doped stack structure after the activation processing. It can be understood that, in other embodiments, when the number of doped layers is plural, only the polysilicon layer which is also the innermost layer and the polysilicon layer which is also the outermost layer are intrinsic polysilicon layers, and the other polysilicon layer(s) between adjacent doped layers can be a second doped polysilicon layer(s).

When the polysilicon layer includes the second doped polysilicon layer(s), the dopant concentration of the second doped polysilicon layer(s) can be much smaller than the dopant concentration of the doped layer(s), that is, the doped layer(s) is heavily doped, and the second doped polysilicon layer(s) is lightly doped. In this case, due to the low dopant concentration, the second doped polysilicon layer which is also the innermost layer provides a relatively strong isolation and barrier effect between the doped layer and the tunnel layer, which can further reduce the amount of dopant diffused to the substrate during the activation process. The second doped polysilicon layer which is also the outermost layer can make more dopant in the doped layer diffuse to the outermost layer. In addition, when the number of doped layers is plural, the second doped polysilicon layer between adjacent doped layers improves the uniformity of dopant distribution in the doped layer(s).

In an embodiment, the innermost layer of the initial stack structure is a second doped polysilicon layer, and in the innermost layer, the dopant concentration in the region adjacent to the tunnel layer is smaller than the dopant concentration in the region away from the tunnel layer. In the present embodiment, the innermost layer is a second doped polysilicon layer which is entirely doped, and since the dopant concentration in the region in the innermost layer adjacent to the tunnel layer is smaller than the dopant concentration in the region away from the tunnel layer, the second doped polysilicon layer which is also the innermost layer has a dopant concentration gradient, and the side with a lower dopant concentration is conducive to further enhancing the isolation and barrier effect of the innermost layer between the doped layer and the tunnel layer.

In an embodiment, the innermost layer of the initial stack structure is a second doped polysilicon layer, and the dopant in the innermost layer is spaced from the surface of the innermost layer adjacent to the tunnel layer. In the present embodiment, the innermost layer is a second doped polysilicon layer which is locally doped. Since the dopant in the innermost layer is spaced from the surface of the innermost layer adjacent to the tunnel layer, the concentration of the dopant at the surface of the innermost layer adjacent to the tunnel layer can be substantially equal to zero, which is conducive to further enhancing the isolation and barrier effect of the innermost layer between the doped layer and the tunnel layer.

Figure 7:
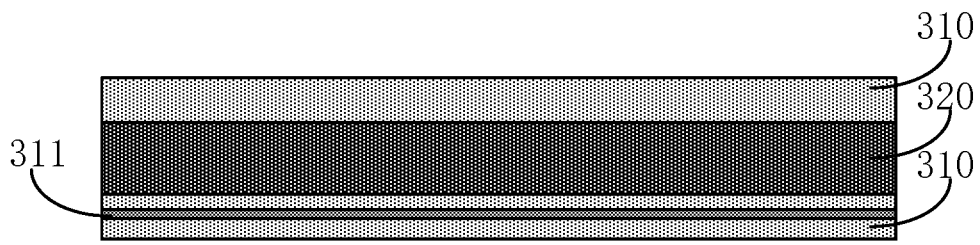
FIG. 7 is a schematic structural view of an initial stack structure according to yet another embodiment.

Optionally, as shown in FIG. 7, the dopant in the innermost layer can be located in the center region of the innermost layer, and the dopant concentration at the upper surface and the lower surface in the innermost layer can be substantially equal to zero. In FIG. 7, 30 is the reference sign for an initial stack structure, 310 is the reference sign for a polysilicon layer, 320 is the reference sign for a doped layer, and 311 is the reference sign for a dopant layer in the center region of the innermost layer. The upper surface with the dopant concentration substantially equal to zero can further enhance diffusion of the dopant from the adjacent doped layer toward the innermost layer, so as to improve the uniformity of diffusion. The lower surface with the dopant concentration substantially equal to zero can further enhance the isolation and barrier effect of the innermost layer between the doped layer and the tunnel layer.

Figure 8:
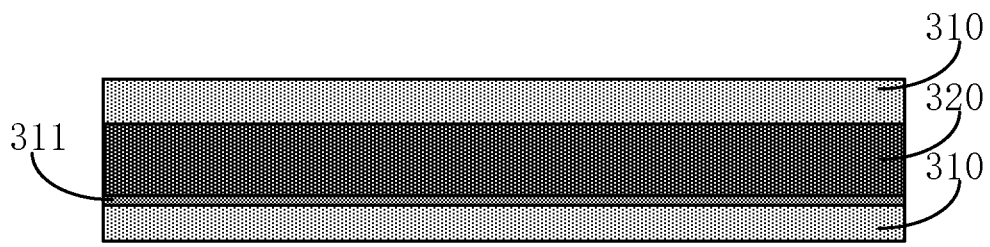
FIG. 8 is a schematic structural view of an initial stack structure according to yet another embodiment.

Optionally, as shown in FIG. 8, the dopant in the innermost layer can be located at the upper region in the innermost layer, and the dopant concentration in the center region and the lower region in the innermost layer can be substantially equal to zero. In FIG. 8, 30 is the reference sign for an initial stack structure, 310 is the reference sign for a polysilicon layer, 320 is the reference sign for a doped layer, and 311 is the reference sign for a dopant layer in the upper region of the innermost layer. The region whose dopant concentration is substantially equal to zero is larger than the region whose dopant concentration is above zero, further enhancing diffusion of the dopant from the adjacent doped layer toward the innermost layer, thereby improving the uniformity of diffusion. In addition, the isolation and barrier effect of the innermost layer between the doped layer and the tunnel layer is further enhanced.

Figure 9:
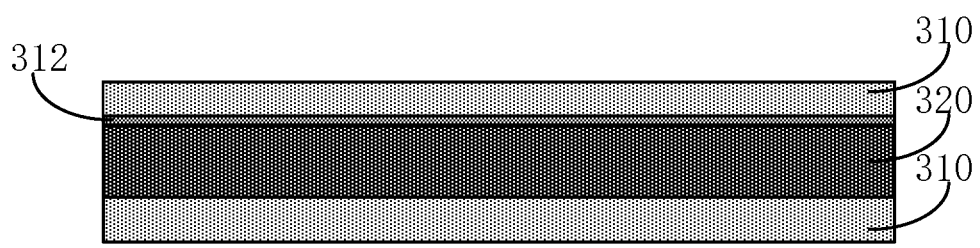
FIG. 9 is a schematic structural view of an initial stack structure according to yet another embodiment.

In an embodiment, the outermost layer in the initial stack structure is a second doped polysilicon layer. In the outermost layer, the dopant is spaced from the surface of the outermost layer away from the tunnel layer. In the present embodiment, the outermost layer is a second doped polysilicon layer which is locally doped. Since the dopant in the outermost layer is spaced from the surface of the outermost layer away from the tunnel layer, the dopant concentration at this surface (e.g., upper surface) of the outermost layer can be substantially equal to zero, which is conducive to diffusion of the dopant from the doped layer toward the outermost layer. Further optionally, as shown in FIG. 9, the dopant in the outermost layer can be located at the lower surface in the outermost layer. In FIG. 9, 30 is the reference sign for an initial stack structure, 310 is the reference sign for a polysilicon layer, 320 is the reference sign for a doped layer, and 312 is the reference sign for a doped lower surface of the outermost layer. The upper surface with the dopant concentration substantially equal to zero is conducive to enhancing diffusion of the dopant from the doped layer toward the outermost layer, thereby improving the uniformity of diffusion.

In an embodiment, the doped layer has a higher refractive index than the polysilicon layer. The refractive indexes of the polysilicon layer and the doped layer are respectively positively correlated with the dopant concentrations of the dopant in the polysilicon layer and the doped layer. Based on the refractive index difference between the polysilicon layer and the doped layer, the diffusion of the dopant from the doped layer to the polysilicon layers on the two sides during the activation process can be further ensured, thereby improving the distribution uniformity of the dopant in the doped stack structure.

Optionally, the refractive index of the doped layer is in a range from 4.1 to 4.5, and the refractive index of the polysilicon layer is in a range from 3.88 to 4.10, which can further ensure that the initial stack structure effectively provides the isolation and barrier effect between the doped layer and the tunnel layer. In addition, after the activation process of the dopant, the dopant can be more uniformly distributed in the doped stack structure. The refractive index of each layer can be tested by using an ellipsometer, which is not further limited in the present embodiment.

In an embodiment, the dopant concentration in the doped stack structure is in a range from 1E20 atoms/cm$^3$ to 8E20 atoms/cm$^3$, and the dopant concentration difference between any two regions in the doped stack structure is less than or equal to 2E20 atoms/cm$^3$. On the one hand, as the dopant concentration is in the range from 1E20 atoms/cm$^3$ to 8E20 atoms/cm$^3$, the doped stack structure has a relatively high dopant concentration. On the other hand, as the dopant concentration difference between any two regions in the doped stack structure is less than or equal to 2E20 atoms/cm$^3$, the dopant concentration is similar everywhere in the doped stack structure, and the dopant is uniformly distributed. Thus, the doped stack structure prepared by the preparation method of the above embodiments has a relatively low back contact resistivity, and the solar cell including the passivating contact structure has a relatively high photoelectric conversion efficiency.

Figure 10:
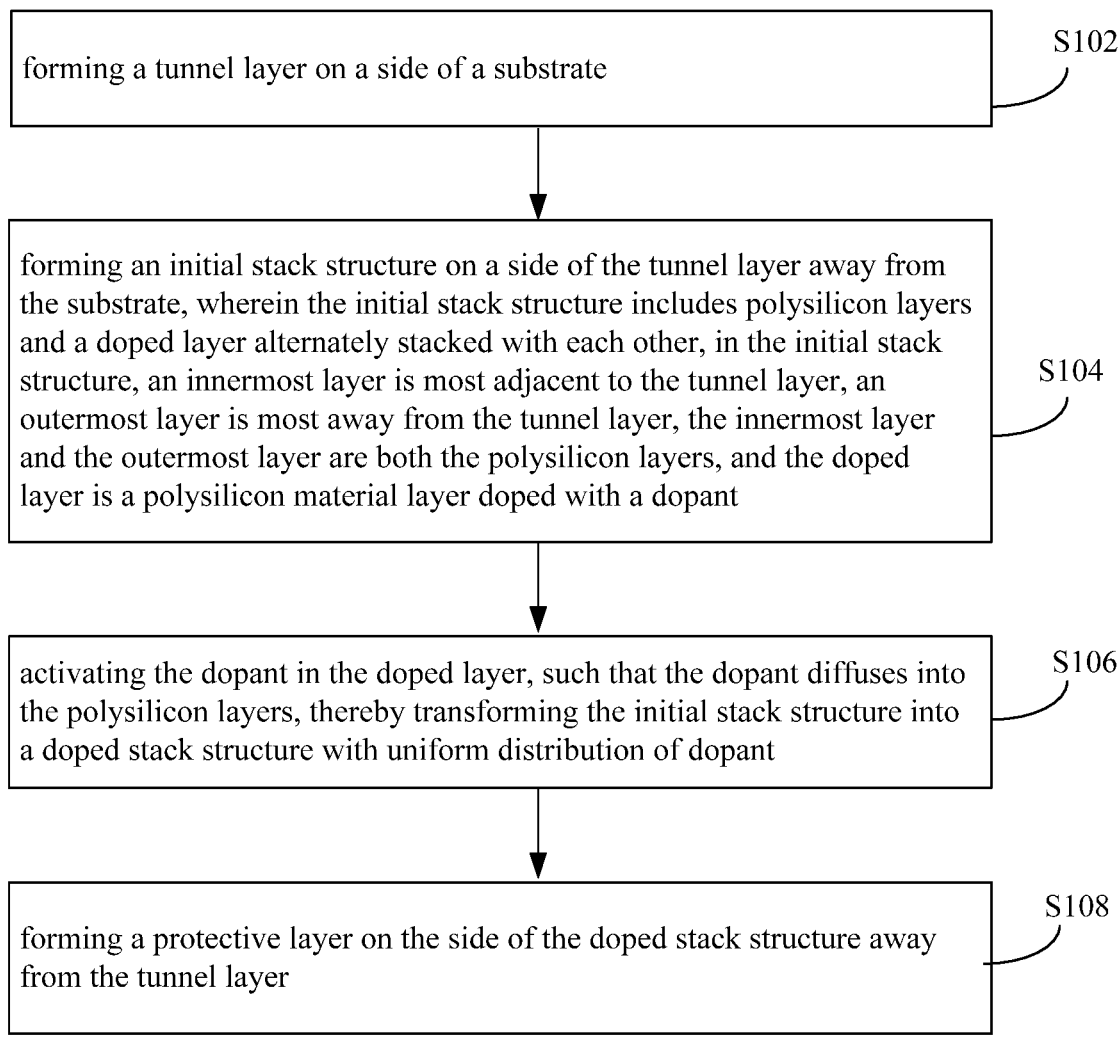
FIG. 10 is a flow chart of a preparation method of a passivating contact structure according to another embodiment.

In an embodiment, as shown in FIG. 10, the above-described preparation method can further include step 108.

Step 108, a protective layer is formed on the side of the doped stack structure away from the tunnel layer.

Figure 11:
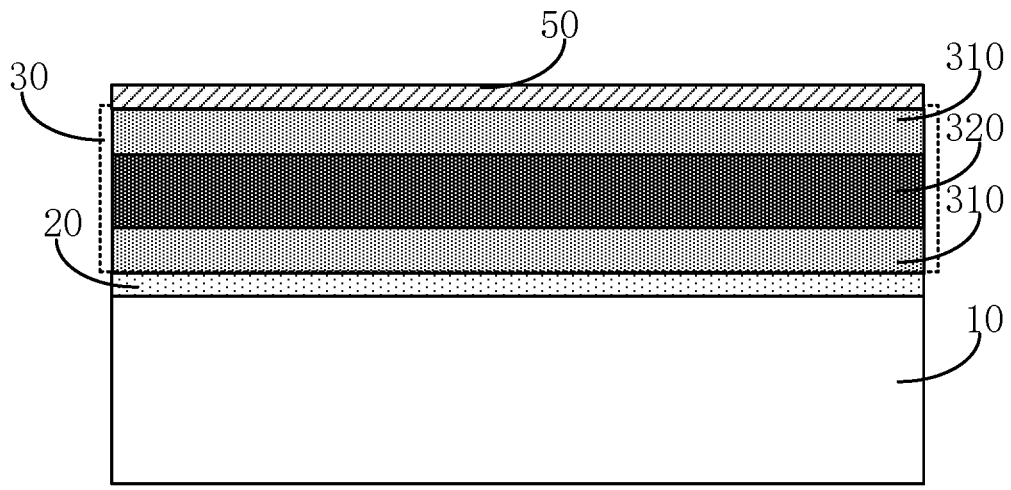
FIG. 11 is a schematic structural view of a passivating contact structure according to yet another embodiment.

In FIG. 11, 50 is the reference sign for a protective layer. As shown in FIG. 11, the protective layer covers the side of the doped stack structure away from the tunnel layer, and provides a masking effect on the doped stack structure, protecting the doped stack structure from being damaged in subsequent other processes. The material of the protective layer is a material soluble to acid but insoluble to alkali, such as silicon oxide, silicon nitride, or silicon oxynitride.

It can be understood that, in the above embodiments, the doped layer(s), the first doped polysilicon layer(s), and the second doped polysilicon layer(s) can all be in-situ doped polysilicon layers or ex-situ doped polysilicon layers, as long as the dopant meets the corresponding diffusion requirements. In the above embodiments, the sizes, thicknesses, doping types, and preparation methods of the substrate, the tunnel layer, the polysilicon layer(s), the doped layer(s), and the protective layer are not limited, and can be adjusted according to actual needs. Taking the preparation methods as an example, the tunnel layer, polysilicon layer(s), and doped layer(s) in the above embodiments can be formed by plasma enhanced chemical vapor deposition (PECVD). The temperature used in the PECVD is relatively low, which can avoid high temperature damage to the substrate. The quality of film obtained by PECVD is relatively good, which is conducive to improving the quality of the doped stack structure.

It can be understood that, in addition to the steps mentioned in the above embodiments, the preparation method of the passivating contact structure can further include other steps according to actual needs, so as to obtain corresponding process effects. For example, before forming the tunnel layer on one side of the substrate, the method can further include one or more of the following steps: texturizing a surface of the substrate; forming a dielectric layer, such as a borosilicate glass (BSG) or a phosphosilicate glass (PSG); boron/phosphorus diffusion (for example, the substrate is doped with boron when being an N-type silicon wafer; the substrate is doped with phosphorus when being a P-type silicon wafer); removing the dielectric layer, polishing, etc., so that the substrate can further meet the process requirements and improve the process effects, which are not further limited in the present embodiment. For example, the textured surface of the substrate can enhance the light-trapping effect and improve the conversion efficiency of the solar cell. For example, the removing of the dielectric layer can block the current leakage.

The present application also provides a passivating contact structure, which is prepared by the method for preparing the passivating contact structure in the above-described embodiments. For related descriptions of the passivating contact structure, reference can be made to the descriptions in the above embodiments, which will not be repeated herein.

The passivating contact structure of the present embodiment is prepared by the preparation method of the above embodiments. The tunnel layer of the passivating contact structure provides a relatively high passivation effect, and the distribution of dopant inside the doped stack structure of the passivating contact structure is relatively uniform. Therefore, the passivating contact structure of the present embodiment has relatively low contact resistivity, which can improve the conversion efficiency of the solar cell.

The present application further provides a solar cell, including a substrate and the passivating contact structure in the above-described embodiment. The passivating contact structure is located on one side of the substrate. For related descriptions of the substrate and the passivating contact structure, reference can be made to the descriptions in the above embodiments, and details are not repeated herein.

The solar cell of the present application includes the substrate and the passivating contact structure with a relatively low contact resistivity in any of the above embodiments, so that the solar cell has relatively high conversion efficiency.

Figure 12:
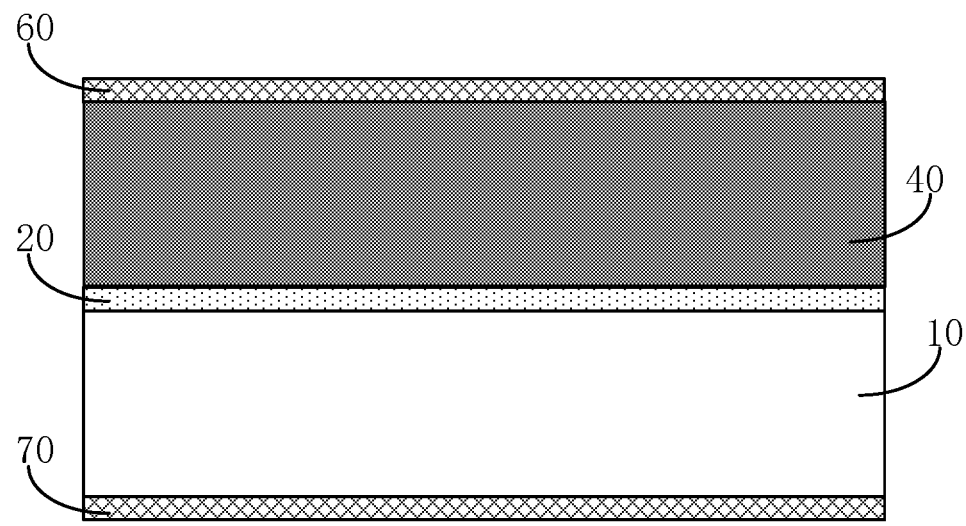
FIG. 12 is a schematic structural view of a solar cell according to an embodiment.

In an embodiment, as shown in FIG. 12, the solar cell further includes a first passivation layer 60.

The first passivation layer 60 is located on the side of the passivating contact structure away from the tunnel layer 20. The first passivation layer 60 can provide surface passivation and anti-reflection effects on the back surface of the substrate 10, so as to improve the absorption rate of solar radiation by the back surface of the solar cell. The material of the first passivation layer 60 can be any one or at least two of aluminum oxide, silicon oxide, silicon nitride, or silicon oxynitride, and for example, can be any one of silicon oxide or silicon oxynitride.

In an embodiment, the substrate includes a first surface and a second surface opposite to each other, and the passivating contact structure is disposed on the second surface. Referring to FIG. 12, the solar cell further includes a second passivation layer 70.

The second passivation layer 70 is disposed on one side of the substrate 10 away from the tunnel layer 20. The second passivation layer 70 can provide surface passivation effect on the dangling bonds on the front surface of the substrate 10, and plays an anti-reflection effect on the front surface of the substrate 10. Optionally, the material of the second passivation layer 70 can be any one or at least two of aluminum oxide, silicon oxide, silicon nitride, or silicon oxynitride, and for example, can be any one of silicon oxide or silicon oxynitride.

It can be understood that the first passivation layer 60 and the second passivation layer 70 in the above embodiments can be a single-layer structure or a stacked multi-layer structure according to actual needs, so as to realize corresponding passivation and anti-reflection effects.

It can be understood that the above embodiments only show a part of the structure of the solar cell, and in other embodiments, the solar cell further includes other corresponding related structures. For example, the solar cell can include a back electrode formed, e.g., by screen-printing, in an opening area formed in the first passivation layer, and a front electrode formed, e.g., by screen-printing, in an opening area formed in the second passivation layer. The front electrode can further include a doped conductive layer and an electrode layer. The doped conductive layer is formed in the opening area and in an ohmic contact with the substrate, and the electrode layer is formed on the doped conductive layer, which are not further described herein.

The present application further provides a method for preparing a solar cell, including steps of: providing a substrate, and forming the passivating contact structure on one side of the substrate according to the method for preparing the passivating contact structure in any of the above embodiments. For related descriptions of the steps of providing the substrate and the steps of forming the passivating contact structure, reference can be made to the descriptions in the above embodiments, and details are not repeated herein.

The preparation method of the solar cell of the present embodiment can obtain relatively low contact resistivity and relatively high conversion efficiency of solar cell, by providing the substrate and forming the passivating contact structure on one side of the substrate according to the method for preparing the passivating contact structure in any of the above embodiments.

In an embodiment, the method for preparing the solar cell further includes a step of forming a first passivation layer on the side of the passivating contact structure away from the tunnel layer. For related descriptions of the first passivation layer, reference can be made to the descriptions of the above embodiments, which will not be repeated herein.

In an embodiment, the substrate includes a first surface and a second surface opposite to each other, and the passivating contact structure is located on the second surface. The method for preparing the solar cell further includes a step of forming a second passivation layer on the first surface of the substrate. For related descriptions of the second passivation layer, reference can be made to the descriptions of the above embodiments, which will not be repeated herein.

It can be understood that the sizes, the thicknesses, and the preparation methods of first passivation layer and second passivation layer are not limited and can be adjusted according to actual needs.

It can be understood that, in addition to the steps of the method for preparing the solar cell mentioned in the above embodiments, the preparation method of the solar cell can further include other steps according to actual needs, so as to obtain corresponding process effects, which will not be further limited herein. For example, the method can further include one or more of the following steps: etching the first passivation layer or the second passivation layer to form an opening area therein; screen-printing the back electrode in the opening area in the first passivation layer; screen-printing the front electrode in the opening area in the second passivation layer; in forming of the front electrode, forming a doped conductive layer in the opening area and in an ohmic contact with the substrate, forming an electrode layer on the doped conductive layer, etc.; sintering the solar cell product and light injection for the solar cell product to passivate the defects therein, thereby further increasing the conversion efficiency, which will not be further described herein.

The passivating contact structure, the method for preparing the passivating contact structure, the solar cell, and the method for preparing the solar cell in the above embodiments are further described with a specific example below:

In the present example, the method includes following steps:

Step 202, a pristine silicon wafer is subjected to texturing, boron diffusion, borosilicate glass removal, and polishing, so as to obtain a pretreated silicon wafer.

Step 204, a tunnel oxide layer is formed on a second surface of the pretreated silicon wafer by PECVD, and one intrinsic polysilicon layer, a first doped polysilicon layer, and another intrinsic polysilicon layer are sequentially formed and stacked on the side of the tunnel oxide layer away from the pretreated silicon wafer. Reference can be made to FIG. 2, in this example, the doped layer in FIG. 2 includes a first doped polysilicon layer. The refractive index of each intrinsic polysilicon layer is in a range from 3.88 to 4.10, and the refractive index of the doped layer is in a range from 4.1 to 4.5.

Step 206, the dopant of the doped layer is annealed, so that the dopant diffuses into the intrinsic polysilicon layers to form a doped stack structure as shown in FIG. 4, thereby obtaining a passivating contact structure A1, wherein 110 is the reference sign for the region of the silicon wafer into which the dopant is diffused through the tunnel oxide layer, the dopant is distributed in a gradient pattern; 120 is the reference sign for the silicon wafer without dopant.

Step 208, a first passivation layer is formed on the side of the passivating contact structure A1 away from the tunnel layer, a second passivation layer is formed on a first surface of the pretreated silicon wafer, a back electrode is screen-printed on the first passivation layer, a front electrode is screen-printed on the second passivation layer, and the structure is subjected to a light injection and annealing process to obtain a 210R sized N-TOPCon solar cell B1.

In an comparative example, the method includes following steps:

Step 302, a pristine silicon wafer is subjected to texturing, boron diffusion, borosilicate glass removal, and polishing, so as to obtain a pretreated silicon wafer.

Step 304, a tunnel layer is formed on a second surface of the pretreated silicon wafer, and a doped polysilicon layer is formed on the side of the tunnel layer away from the pretreated silicon wafer to obtain a passivating contact structure A2.

Step 306, a first passivation layer is formed on the side of the passivating contact structure A2 away from the tunnel layer, a second passivation layer is formed on a first surface of the pretreated silicon wafer, a back electrode is screen-printed on the first passivation layer, a front electrode is screen-printed on the second passivation layer, and the structure is subjected to a light injection and annealing process to obtain a 210R sized N-TOPCon solar cell B2.

Figure 13:
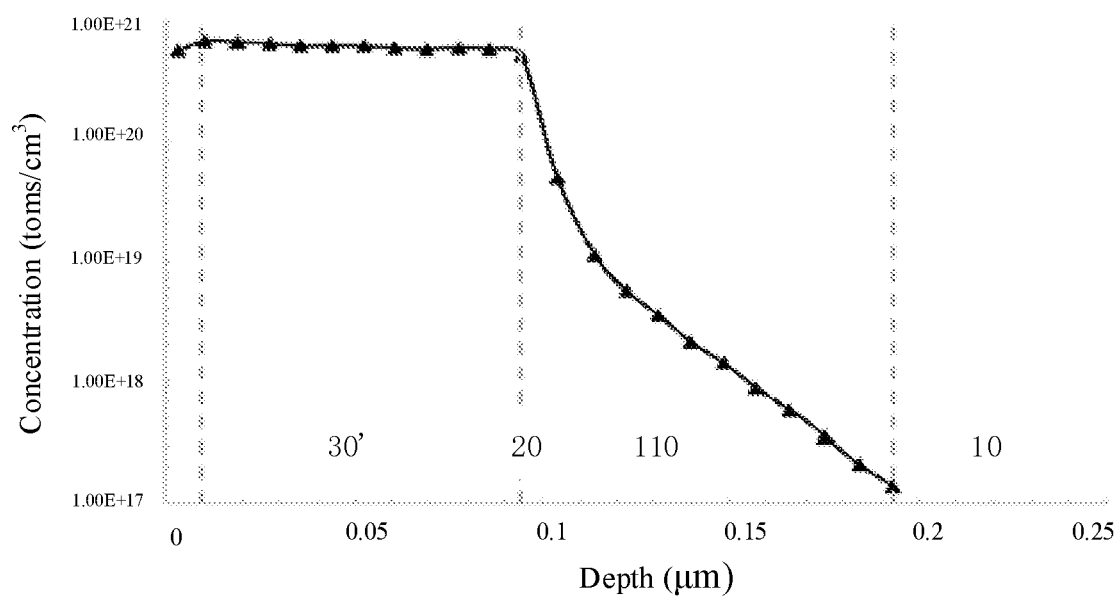
FIG. 13 shows the electrochemical capacitance-voltage (ECV) profile of a passivating contact structure A1 according to an embodiment.

As shown in FIG. 13, which shows the ECV profile of the passivating contact structure A1, wherein the different sections on the abscissa respectively correspond to the doped stack structure 30', the tunnel layer 20, the doped crystalline silicon layer 110, and the substrate 10. The concentration of dopant in the doped stack structure is generally in a range from 1E20 atoms/cm$^3$ to 8E20 atoms/cm$^3$, and the difference of dopant concentration between any two regions in the doped stack structure is less than 2E20 atoms/cm$^3$. The dopant concentration is substantially the same in everywhere in the doped stack structure and the ECV profile is substantially a horizontal line. The total amount of dopant diffused into the silicon substrate through the tunnel oxide layer is relatively small.

For the N-TOPCon solar cell B1 and the N-TOPCon solar cell B2, the electrical performances are shown in Table 1, and the specific contact resistances measured by transmission line model (TLM) are shown in Table 2. In Table 1, Eta represents the conversion efficiency, Isc represents the short circuit current, Uoc represents the open circuit voltage, FF represents the fill factor, Rs/mohm represents the serial resistance, Rsh/ohm represents the parallel resistance, and Irev2 represents the reverse current.

TABLE 1

Electrical performances of N-TOPCon solar cells

| | Counts | Eta/% | Isc/A | Uoc/mV | FF/% | Rs/mohm | Rsh/ohm | Irev2/A |
|---|---|---|---|---|---|---|---|---|
| B2 | 1000 | 24.856 | 15.97 | 721.65 | 82.351 | 0.000735 | 2620 | 0.0468 |
| B1 | 1000 | 25.041 | 15.991 | 723.3 | 82.67 | 0.000718 | 2657 | 0.0391 |
| GAP (B1 − B2) | | 0.185 | 0.021 | 1.65 | 0.319 | −0.000017 | 37 | −0.0077 |

TABLE 2

Specific contact resistances measured by TLM

| | Square resistance/((Ω/sq) | ρc |
|---|---|---|
| B2 | 36.72 | 1.995 |
| B1 | 37.31 | 1.49 |

It can be seen from the above test results that for the N-TOPCon solar cell B1 in the present example, Uoc, Isc, and FF are all increased, and Rs and back contact resistance are all reduced, and after annealing, the crystallization of the doped stack structure is improved, resulting 0.2% increase of the overall conversion efficiency, while the conversion efficiency of the comparative N-TOPCon solar cell B2 is only increased by 0.05%.

The present application further provides a photovoltaic device. The photovoltaic device includes a cell group. The cell group includes one or more connected solar cells provided by any of the above embodiments or prepared by using the method for preparing the solar cell provided by any of the above embodiments.

The photovoltaic device further includes an encapsulation layer and a cover plate. The encapsulation layer is configured to cover the surface of the cell group, and the cover plate is configured to cover the surface of the encapsulation layer away from the cell group. The solar cells are electrically connected in the form of a whole piece or multiple pieces to form multiple cell groups, and the multiple cell groups are electrically connected in series and/or in parallel. Specifically, in some embodiments, multiple cell groups can be electrically connected through conductive strips. The encapsulation layer covers the surface of the solar cell. Exemplarily, the encapsulation layer can be an organic encapsulation film such as an ethylene-vinyl acetate copolymer film, a polyethylene-octene elastomer film, or a polyethylene terephthalate film. The cover plate can be a cover plate with a light-transmitting function, such as a glass cover plate or a plastic cover plate.

The present application further provides a photovoltaic system, including the photovoltaic device in any of the above embodiments. The photovoltaic system can be applied to photovoltaic power stations, such as ground power stations, roof power stations, water surface power stations, etc., and can also be applied to equipment or devices that use solar energy to generate electricity, such as user solar power supplies, solar street lights, solar cars, solar buildings, etc. It also can be understood that the application scenarios of the photovoltaic system are not limited to the above, that is to say, the photovoltaic system can be applied in all fields that need to use solar energy to generate electricity. Taking a photovoltaic power generation network as an example, the photovoltaic system can include photovoltaic arrays, a combiner box, and an inverter. The photovoltaic array can be an array of photovoltaic devices. For example, multiple photovoltaic devices can form multiple photovoltaic arrays. The photovoltaic arrays are connected to the combiner box. The combiner box can combine the currents generated by the photovoltaic arrays. The combined current flows through the inverter and is converted into the alternating current suitable for the power grid, and then conducted to the power grid to realize solar power supply.

It should be understood that, though the steps in the flow charts involved in the above embodiments are shown sequentially as indicated by the arrows, these steps are not necessarily executed sequentially in the order indicated by the arrows. Unless otherwise specified herein, the sequence of the steps is not strictly limited, and the steps may be performed in other orders. Moreover, at least some of the steps in the flow charts involved in the above embodiments can include multiple sub-steps or multiple stages, these sub-steps or stages are not necessarily performed at the same time, but may be performed at different times. These sub-steps or stages are not necessarily to be sequentially performed, but can be performed alternately or in turn with at least some of the sub-steps or stages of other steps.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application. The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A method for preparing a passivating contact structure, comprising:

forming a tunnel layer on a side of a substrate;

forming an initial stack structure on a side of the tunnel layer away from the substrate, wherein the initial stack structure includes a plurality of polysilicon layers and a plurality of doped layers alternately stacked with each other, in the initial stack structure, an innermost layer is a layer most adjacent to the tunnel layer, an outermost layer is a layer most away from the tunnel layer, the innermost layer and the outermost layer are two of the polysilicon layers, and the doped layers are polysilicon material layers doped with a dopant; and activating the dopant in the doped layers, such that the dopant diffuses into the polysilicon layers, thereby transforming the initial stack structure into a doped stack structure with uniform distribution of the dopant;

wherein before activating the dopant in the doped layers, the dopant concentration of regions of each doped layer adjacent to the polysilicon layers is smaller than the dopant concentration of a region of the each doped layer away from the polysilicon layers, and the dopant concentration of the regions of the each doped layer adjacent to the polysilicon layers is greater than the dopant concentration of the polysilicon layers.

2. The method according to claim 1, wherein before activating the dopant in the doped layers, the dopant concentration of the each doped layer is symmetrically distributed from a central plane of the each doped layer to two sides of the each doped layer away from the central plane, and the distance between the central plane and one of the two sides of the each doped layer away from the substrate is equal to the distance between the central plane and the other one of two sides of the each doped layer adjacent to the substrate.

3. The method according to claim 1, wherein the doped layers include a plurality of first doped polysilicon layers, and the plurality of first doped polysilicon layers are stacked in a direction away from the tunnel layer.

4. The method according to claim 3, wherein the plurality of first doped polysilicon layers are arranged symmetrically about a central plane of the doped layers, and the dopant in every two of the plurality of first doped polysilicon layers that are symmetrically arranged is distributed symmetrically about the central plane, the distance between the central plane and one side of the doped layers away from the substrate is equal to the distance between the central plane and another side of the doped layers adjacent to the substrate.

5. The method according to claim 1, wherein on a condition that the plurality of doped layers have the same dopant concentration, the thickness of the polysilicon layer between two adjacent doped layers is greater than each of the thickness of the polysilicon layer which is also the innermost layer and the thickness of the polysilicon layer which is also the outermost layer.

6. The method according to claim 1, wherein each of the polysilicon layers includes an intrinsic polysilicon layer or a second doped polysilicon layer, and the dopant concentration of the second doped polysilicon layer is smaller than the dopant concentration of the doped layers.

7. The method according to claim 6, wherein the innermost layer in the initial stack structure is the second doped polysilicon layer, and the dopant concentration of a region of the innermost layer adjacent to the tunnel layer is smaller than the dopant concentration of a region of the innermost layer away from the tunnel layer.

8. The method according to claim 6, wherein the innermost layer in the initial stack structure is the second doped polysilicon layer, and a dopant position in the innermost layer is spaced from a surface of the innermost layer adjacent to the tunnel layer.

9. The method according to claim 6, wherein the outermost layer in the initial stack structure is the second doped polysilicon layer, and a dopant position in the outermost layer is spaced from a surface of the outermost layer away from the tunnel layer.

10. The method according to claim 1, wherein a refractive index of the doped layers is greater than a refractive index of the polysilicon layers.

11. The method according to claim 10, wherein the refractive index of the doped layers is in a range from 4.1 to 4.5, and the refractive index of the polysilicon layers is in a range from 3.88 to 4.10.

12. The method according to claim 1, wherein the dopant concentration of the doped stack structure is in a range from 1E20 atoms/cm$^3$ to 8E20 atoms/cm$^3$, and a dopant concentration difference between any two regions in the doped stack structure is less than or equal to 2E20 atoms/cm$^3$.

13. A method for preparing a solar cell, comprising:
provide a substrate;
forming a passivating contact structure on one side of the substrate by the method according to claim 1.

* * * * *